United States Patent
Ishigaki et al.

(10) Patent No.: US 9,362,409 B2
(45) Date of Patent: Jun. 7, 2016

(54) SEMICONDUCTOR DEVICE

(71) Applicant: Japan Display Inc., Tokyo (JP)

(72) Inventors: Toshimasa Ishigaki, Chiba (JP); Fumio Takahashi, Mobara (JP); Hideki Kuriyama, Mobara (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 14/798,413

(22) Filed: Jul. 13, 2015

(65) Prior Publication Data

US 2015/0318404 A1    Nov. 5, 2015

Related U.S. Application Data

(63) Continuation of application No. 14/495,111, filed on Sep. 24, 2014, now Pat. No. 9,136,288, which is a continuation of application No. 13/849,559, filed on Mar. 25, 2013, now Pat. No. 8,878,185.

(30) Foreign Application Priority Data

May 9, 2012   (JP) .................................. 2012-107694

(51) Int. Cl.
*H01L 33/08*   (2010.01)
*H01L 27/12*   (2006.01)
(Continued)

(52) U.S. Cl.
CPC ...... *H01L 29/78606* (2013.01); *H01L 27/1248* (2013.01)

(58) Field of Classification Search
CPC ........ H01L 33/08; H01L 27/12; G02F 1/1362
USPC .............. 257/59, 99, 72, 40, 83, 84; 438/158, 438/149
See application file for complete search history.

(56) References Cited

U.S. PATENT DOCUMENTS

| 5,877,832 A | 3/1999 | Shimada |
| 6,717,632 B2 | 4/2004 | Ha et al. |

(Continued)

FOREIGN PATENT DOCUMENTS

| JP | H09-304793 A | 11/1997 |
| JP | 2001-111060 A | 4/2001 |

(Continued)

OTHER PUBLICATIONS

Office Action dated Jul. 28, 2015 regarding a counterpart Japanese patent application No. 2012-107694.

(Continued)

*Primary Examiner* — Sheng Zhu
(74) *Attorney, Agent, or Firm* — Typha IP LLC

(57) ABSTRACT

A manufacturing method of a display device having an array substrate includes the steps of forming a projection of an organic material in a pixel on the array substrate by patterning a photosensitive material or by inkjet, forming a TFT on the array substrate, wherein a source electrode of the TFT is formed to extend on at least part of the upper surface of the projection, forming an inorganic passivation layer over the TFT and over at least part of the upper surface of the projection, forming an organic passivation layer over the inorganic passivation layer, forming an upper insulating layer over at least part of the organic passivation layer, forming a contact hole in the inorganic passivation layer and the upper insulation layer over the upper surface of the projection, and forming a pixel electrode on the upper insulation layer which contacts the source electrode.

8 Claims, 17 Drawing Sheets

(51) Int. Cl.
    *G02F 1/1362*    (2006.01)
    *H01L 29/786*    (2006.01)

(56) References Cited

U.S. PATENT DOCUMENTS

| | | |
|---|---|---|
| 6,777,716 B1 | 8/2004 | Yamazaki et al. |
| 7,335,919 B2 | 2/2008 | Koo et al. |
| 7,488,983 B2 | 2/2009 | Lee |
| 7,609,348 B2 | 10/2009 | Nakayama et al. |
| 7,764,342 B2 | 7/2010 | Sato |
| 8,878,185 B2 | 11/2014 | Ishigaki et al. |

FOREIGN PATENT DOCUMENTS

| | | |
|---|---|---|
| JP | 2004-070196 A | 3/2004 |
| JP | 2007-310152 A | 11/2007 |
| JP | 2011-059314 A | 3/2011 |

OTHER PUBLICATIONS

Office Action dated May 19, 2015 regarding a counterpart Chinese patent application No. 201310114477.8.

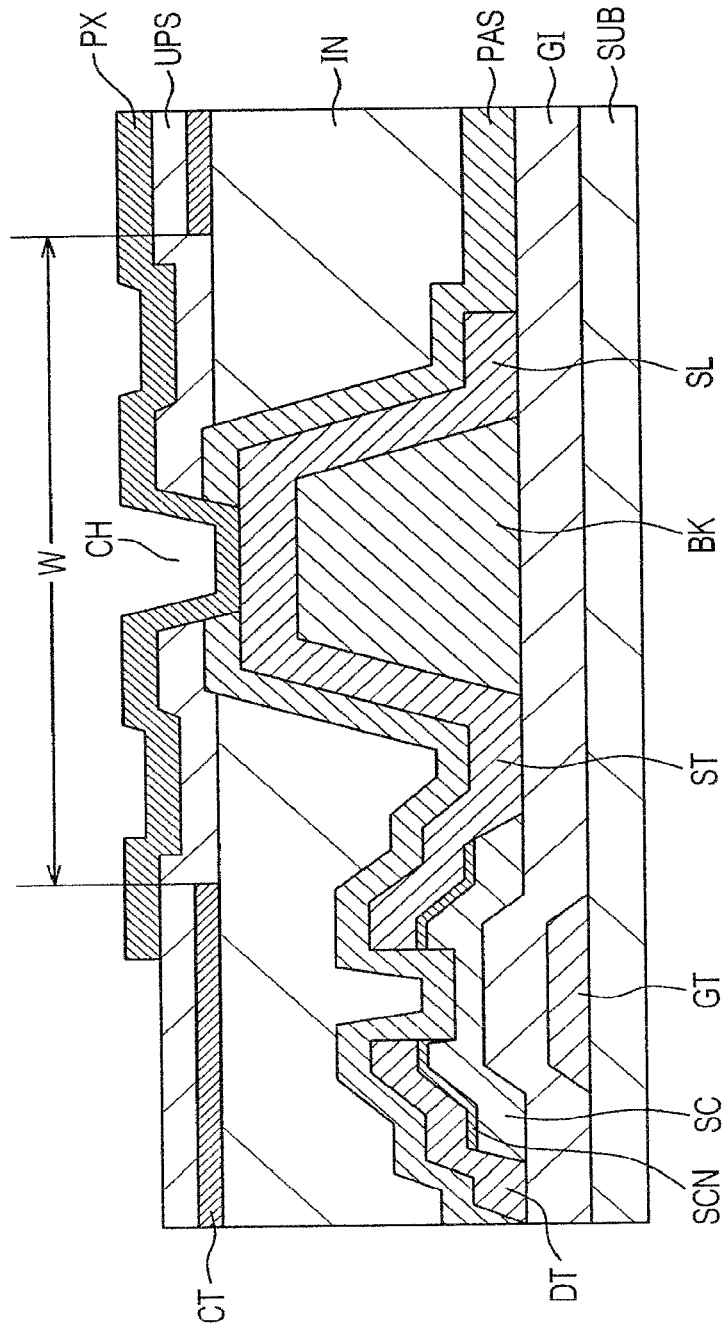

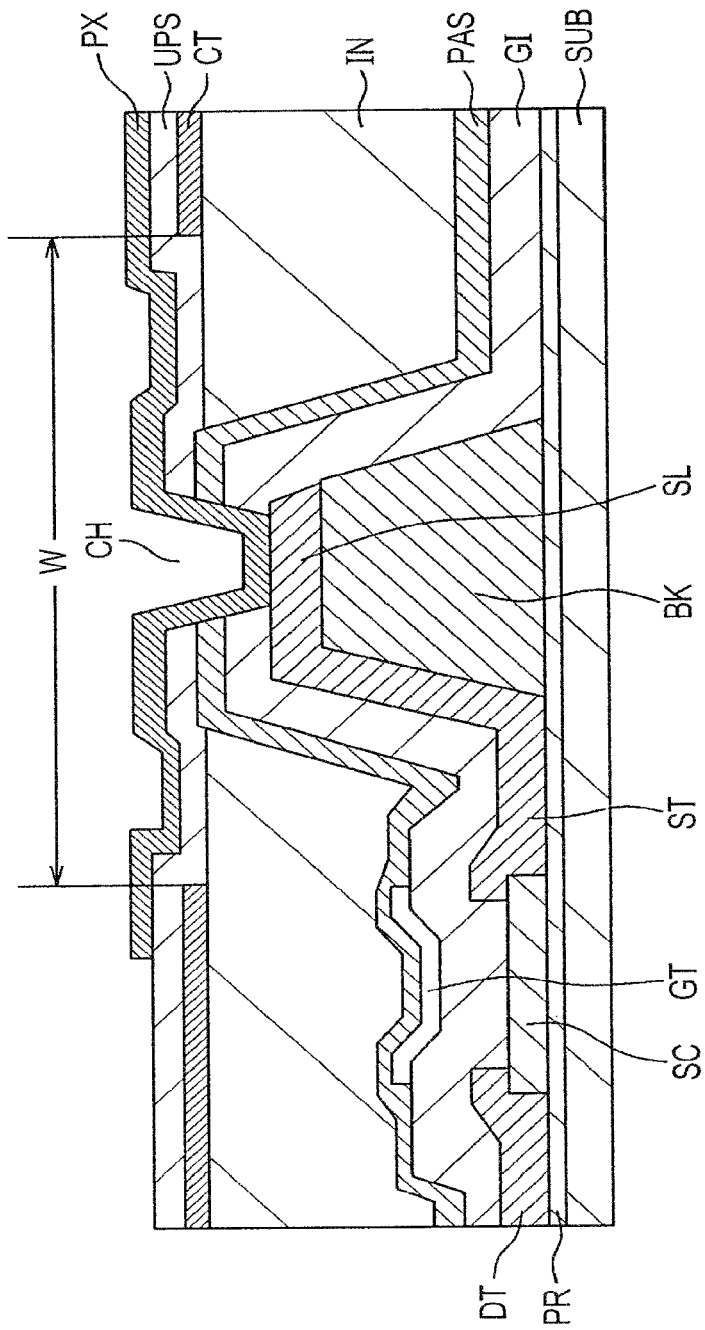

SEMICONDUCTOR DEVICE

CROSS REFERENCE TO RELATED APPLICATION

This application is a continuation of U.S. patent application Ser. No. 14/495,111, filed on Sep. 24, 2014, which, in turn, is a continuation application of U.S. patent application Ser. No. 13/849,559 (now U.S. Pat. No. 8,878,185), filed Mar. 25, 2013, which claims the priority from Japanese Patent Application No. 2012-107694 filed on May 9, 2012 in the Japanese Patent Office, the entire contents of which are incorporated herein by reference.

CLAIM OF PRIORITY

The present application claims priority from Japanese Patent Application NO. 2012-107694 filed on May 9, 2012, the content of which is hereby incorporated by reference into this Application.

BACKGROUND OF THE INVENTION

1. Field of the Invention

The present invention relates to a display device such as a liquid crystal display device, and particularly to a display device whose transmissivity can be improved by reducing the diameter of a contact hole formed in an organic film in a pixel circuit portion of a substrate.

2. Description of the Related Art

In a display device such as a liquid crystal display device, provided are an array substrate (or referred to as a TFT substrate) on which pixel electrodes, thin film transistors (TFTs), and the like are formed in a matrix shape, and an opposed substrate which faces the array substrate and on which color filters and the like are formed at positions corresponding to the pixel electrodes of the array substrate. In addition, liquid crystal is sandwiched between the array substrate and the opposed substrate. The transmissivity of light by liquid crystal molecules is controlled for each pixel to form an image.

As described in Japanese Patent Application Laid-Open No. Hei 9-304793, an attempt to improve the aperture ratio of each pixel in a recent liquid crystal display device has been known. The liquid crystal display device disclosed in Japanese Patent Application Laid-Open No. Hei 9-304793 includes a buried portion to fill a recessed portion generated by forming a pixel electrode in a contact hole formed to connect a thin film transistor and the pixel electrode to each other. Accordingly, the disturbance of orientation of liquid crystal molecules in the contact hole of an organic passivation film can be suppressed, and light transmission is prevented without decreasing the aperture ratio of each pixel of the liquid crystal display device.

SUMMARY OF THE INVENTION

However, a process of photolithography or anisotropic etching needs to be additionally provided to fill the recessed portion in such a liquid crystal display device.

In view of the above-described problems, objects of the present invention are to prevent light transmission without decreasing the aperture ratio of each pixel of a display device such as a liquid crystal display device, to improve the productivity of an organic insulation film, and to improve the processing accuracy around a contact hole in the display device such as a liquid crystal display device having the contact hole formed to connect a thin film transistor and a pixel electrode to each other.

Although the present invention can be recognized from plural viewpoints, a liquid crystal display device according to a representative aspect of the present invention from one viewpoint will be described below. Further, a liquid crystal display device of the present invention from other viewpoints will become apparent from the following descriptions of a mode for carrying out the present invention.

The followings are summaries of representative aspects of the invention disclosed in the application.

(1) A display device which is configured to include an array substrate and an opposed substrate which is faced the array substrate, wherein: a TFT and a projection are disposed in each pixel portion of the array substrate; a source electrode of the TFT extends so as to cover at least a part of the projection; an inorganic passivation film is formed over the TFT and the projection; an organic passivation film is formed on the inorganic passivation film on the TFT; an opposed electrode is formed on the organic passivation film; an upper insulation film is formed over the opposed electrode; a pixel electrode is formed on the upper insulation film; and the pixel electrode is electrically connected to the source electrode through a connection hole formed in the inorganic passivation film and the upper insulation film on the projection.

(2) A display device which is configured to include an array substrate and an opposed substrate which is faced the array substrate, wherein: a TFT and a projection are disposed in each driving circuit portion of the array substrate; a source electrode of the TFT extends so as to cover at least a part of the projection; an inorganic passivation film is formed over the TFT and the projection; an organic passivation film is formed on the inorganic passivation film on the TFT; an upper insulation film is formed over the organic passivation film; a line is formed on the upper insulation film; and the line is electrically connected to the source electrode through a connection hole formed in the inorganic passivation film and the upper insulation film on the projection.

BRIEF DESCRIPTION OF THE DRAWINGS

FIG. 3 is a cross-sectional view of a thin film transistor included in the pixel circuit according to a first embodiment;

FIG. 11 is a cross-sectional view of a thin film transistor included in a pixel circuit according to a third embodiment;

DETAILED DESCRIPTION OF THE INVENTION

Figure 1:
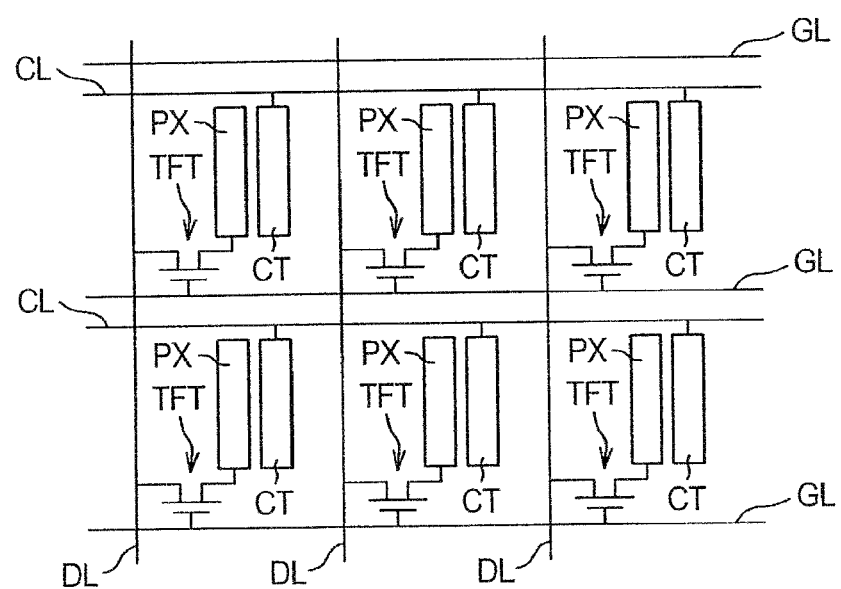
FIG. 1 is a circuit diagram for showing an equivalent circuit of a display device according to an embodiment of the present invention.

Hereinafter, the content of the present invention will be described in detail using embodiments.

It should be noted that constitutional elements having the same functions are given the same reference numerals in the all drawings for explaining the embodiments, and the explanations thereof will not be repeated.

Further, the following embodiments do not limit the interpretation of claims of the present invention.

Further, in examples of the embodiments described below, the present invention is applied to an IPS-mode (In-Plane-Switching Mode) liquid crystal display device. However, the present invention can be applied to other kinds of display devices such as liquid crystal display devices of other modes and organic EL display devices.

First Embodiment

A display device according to the embodiment is a liquid crystal display device, and is configured to include an array substrate (also referred to as a TFT substrate), an opposed substrate which faces the array substrate and on which color filters are provided, a liquid crystal material enclosed in an area sandwiched between the both substrates, and a driver IC attached to the array substrate. Each of the array substrate and the opposed substrate is formed by processing an insulating substrate such as a glass substrate.

FIG. 1 is a circuit diagram for showing an equivalent circuit of a display device according to an embodiment of the present invention. The equivalent circuit shown in FIG. 1 corresponds to a part of display areas in the array substrate. On the array substrate, plural gate signal lines GL are aligned to extend in the lateral direction, and plural video signal lines DL are aligned to extend in the vertical direction. With these gate signal lines GL and video signal lines DL, the display areas are defined in a matrix shape. Each compartment defined in a matrix shape corresponds to one pixel circuit. Further, a common signal line CL extends in the lateral direction while being associated with each gate signal line GL.

A thin film transistor TFT is formed in the corner of each of the pixel circuits defined by the gate signal lines GL and the video signal lines DL. A gate electrode GT of each thin film transistor TFT is connected to the gate signal line GL, and a drain electrode DT thereof is connected to the video signal line DL. Further, a pixel electrode PX and a common electrode CT are formed in a pair in each pixel circuit, each pixel electrode PX is connected to a source electrode ST of the thin film transistor TFT, and each common electrode CT is connected to the common signal line CL.

Figure 2:
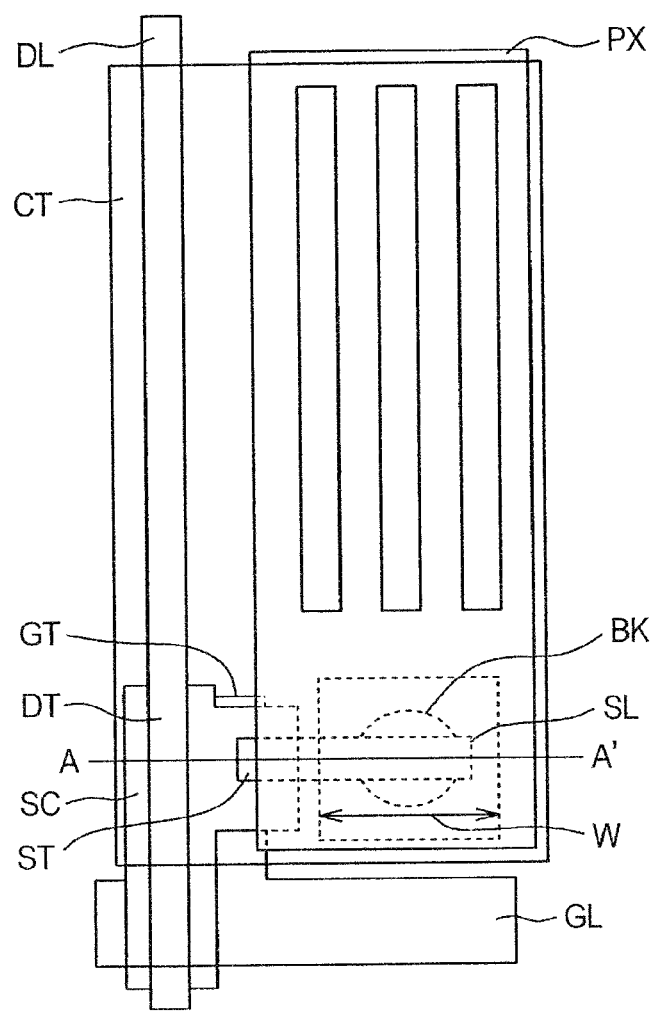
FIG. 2 is a plan view for showing an example of a configuration of one pixel circuit.

FIG. 2 is a plan view for showing an example of a configuration of one pixel circuit. As shown in FIG. 2, the thin film transistor TFT exists at the position where the gate signal line GL intersects with the video signal line DL. The thin film transistor TFT includes a semiconductor film SC, a gate electrode GT, a source electrode ST, and a drain electrode DT.

In the above-described pixel circuit, common voltage is applied to the common electrode CT of each pixel through the common signal line CL, and gate voltage is applied to the gate signal line GL, so that the line of the pixel circuit is selected. Further, a video signal is supplied to each video signal line DL at the selection timing, so that the voltage of the video signal is applied to the pixel electrode PX included in each pixel circuit. Accordingly, lateral electric field with the strength corresponding to the voltage of the video signal is generated between the pixel electrode PX and the common electrode CT, and the orientation of liquid crystal molecules is determined in accordance with the strength of the lateral electric field.

The thin film transistor TFT will be described in detail. The thin film transistor TFT includes the semiconductor film SC, the drain electrode DT, the source electrode ST, and the gate electrode GT. The drain electrode DT is a part of the video signal line DL, and includes a portion whose lower face is in contact with the semiconductor film SC. The drain electrode DT is overlapped with the semiconductor film SC and the gate electrode GT on a plane. Further, the source electrode ST extends in the right direction from a position apart from the drain electrode DT where the semiconductor film SC is overlapped with the gate electrode GT on a plane, and further extends over a projection BK to be connected to the pixel electrode PX. Further, the gate electrode GT extends in the upper direction of the drawing, and the lower end thereof is connected to the gate signal line GL.

FIG. 3 is a cross-sectional view of the thin film transistor TFT included in the pixel circuit. FIG. 3 shows a cross-section taken along the section line A-A of FIG. 2. On a glass substrate SUB, provided is a conductive layer including the gate electrode GT in contact with the glass substrate SUB. On the conductive layer, provided is a gate insulation layer GI. The semiconductor film SC is in contact with the upper face of the gate insulation layer GI, and is provided above the gate electrode GT. Further, on the gate insulation layer GI, provided is the projection BK. On the upper face of the semiconductor film SC, disposed are the source electrode ST and the drain electrode DT that are apart from each other. A source line SL extends over the projection BK from the source electrode ST, and is connected to the pixel electrode PX on the projection BK. An inorganic passivation film PAS is formed over the thin film transistor TFT and the projection BK. In addition, an organic passivation film IN is formed on the inorganic passivation film PAS over the thin film transistor TFT and embedding the projection BK therein.

The common electrode CT, and then an upper insulation film UPS are formed on the organic passivation film IN. The source line SL is connected to the pixel electrode PX at a connection hole CH formed in the common electrode CT and the upper insulation film UPS on the projection BK. In this case, on the projection BK, the source line SL extends from the source electrode along the top of the projection BK from a base portion thereof.

Hereinafter, processes of manufacturing the thin film transistor TFT will be described. FIG. 4A to FIG. 4H are cross-sectional views for showing manufacturing processes of the thin film transistor TFT shown in FIG. 3. In the first process in FIG. 4A, an Mo layer with a thickness of 150 nm is sputtered on the glass substrate SUB, and the gate electrode GT is formed by photolithography and wet etching. For the gate electrode GT, a single layer of low-resistance metal such as Al, Mo, W, Cu, Cu—Al alloy, Al—Si alloy, or Mo—W alloy, or a laminated structure thereof may be used.

In the next process, a silicon nitride film configuring the gate insulation film GI is deposited on the glass substrate SUB on which the gate electrode GT is formed. The silicon nitride film is deposited using a CVD apparatus. Then, an amorphous Si layer and a contact layer SCN are formed using the CVD apparatus, and are etched to be in a desired shape by photolithography to form the semiconductor film SC. It should be noted that the contact layer SCN is an n+layer to make an ohmic contact between semiconductor and a drain/source electrode.

In the next process, a photosensitive material is applied onto the glass substrate SUB on which the semiconductor film SC of the thin film transistor TFT is formed, and then light is selectively irradiated to a desired area of the photosensitive material. Thereafter, the resultant structure is developed for patterning, so that the projection BK with a desired height is formed on the gate insulation film GI (see FIG. 4A). The photosensitive material includes an organic insulation film material, a photospacer material, photoresist, and the like. In short, any material can be used as long as a convex portion can be formed at a desired area on a substrate by exposure and development.

Figure 4A:
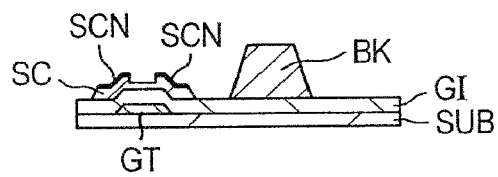
FIG. 4A is a cross-sectional view for showing a manufacturing process of the thin film transistor shown in FIG. 3.
Figure 4B:
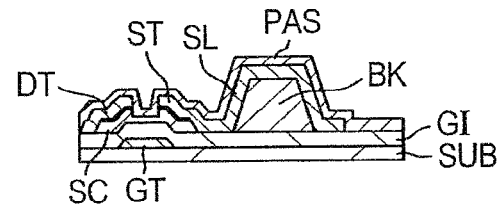
FIG. 4B is a cross-sectional view for showing a manufacturing process of the thin film transistor shown in FIG. 3.

In the next process in FIG. 4B, a Ti layer with a thickness of 100 nm, an AlSi layer with a thickness of 450 nm, and a Ti layer with a thickness of 100 nm are sequentially deposited, and photolithography and dry etching are performed for these films to form the source electrode ST and the drain electrode DT. Instead of depositing these layers, a single layer of low-resistance metal such as Al, Mo, W, Cu, Cu—Al alloy, Al—Si alloy, or Mo—W alloy, or a laminated structure thereof may be deposited. In this case, the source line SL is also formed at the same time by extending from the source electrode ST over the projection BK. The source line SL does not allow light to penetrate. Thus, the line width is desirably narrowed from the viewpoint of the aperture ratio.

Figure 4C:
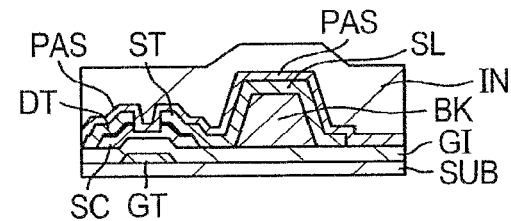
FIG. 4C is a cross-sectional view for showing a manufacturing process of the thin film transistor shown in FIG. 3.
Figure 4D:
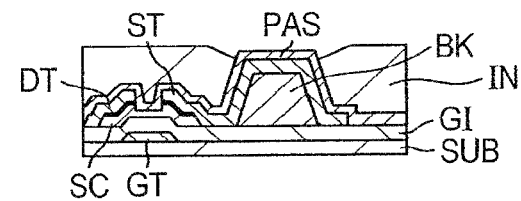
FIG. 4D is a cross-sectional view for showing a manufacturing process of the thin film transistor shown in FIG. 3.
Figure 4E:
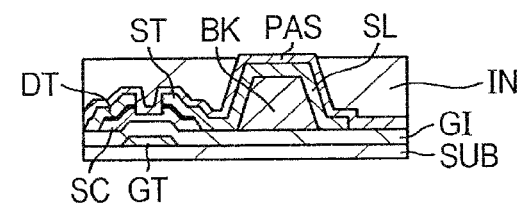
FIG. 4E is a cross-sectional view for showing a manufacturing process of the thin film transistor shown in FIG. 3.

In the next process, a silicon nitride film configuring the inorganic passivation film PAS to prevent moisture and impurities from entering from outside is deposited using a CVD method (FIG. 4B). Thereafter, the organic passivation film IN is applied and formed (FIG. 4C). The organic passivation film IN is applied even onto the projection BK. However, the organic passivation film IN has liquidity before burning, and thus the thickness of the organic passivation film IN on the projection BK can be made smaller than the height of the projection BK. Further, the organic passivation film IN is processed by photolithography, so that an upper portion of the projection BK is exposed (FIG. 4D). In this case, since the thickness of the organic passivation film IN on the projection BK is smaller than the height of the projection BK, the time required for exposure and development can be shortened as compared to a case in which a hole corresponding to the height of the projection BK is processed. Thereafter, the resultant structure is burned while reflow and flattening are performed by heating (FIG. 4E).

Figure 4F:
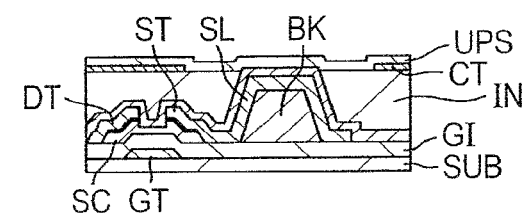
FIG. 4F is a cross-sectional view for showing a manufacturing process of the thin film transistor shown in FIG. 3.
Figure 4G:
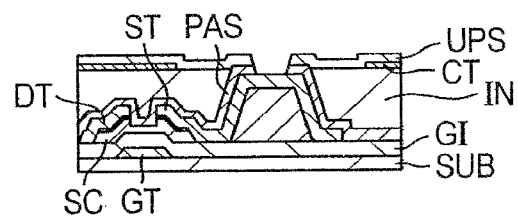
FIG. 4G is a cross-sectional view for showing a manufacturing process of the thin film transistor shown in FIG. 3.

In the next process, for example, a transparent conductive film such as ITO is further deposited and patterned to form the common electrode CT, and then the upper insulation film UPS is formed (FIG. 4F). The common electrode CT is patterned, so that a window W is opened near the projection BK when viewed on a plane. In the next process, the inorganic passivation film PAS and the upper insulation film UPS are collectively processed and opened at the top of the projection BK by photolithography and dry etching, and the source line SL is exposed (FIG. 4G).

Figure 4H:
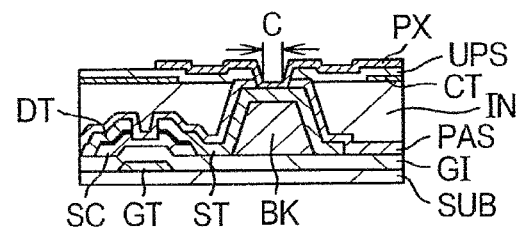
FIG. 4H is a cross-sectional view for showing a manufacturing process of the thin film transistor shown in FIG. 3.

In the next process, for example, a transparent conductive film such as ITO is deposited and patterned to form the pixel electrode PX so as to be connected to the source line SL at the opening portion. Accordingly, the display device including the thin film transistor TFT shown in FIG. 3 can be completed (FIG. 4H). It should be noted that amorphous Si is used for the semiconductor film SC in the embodiment. However, it is obvious that crystalline Si or other semiconductor materials may be used.

Figure 5:
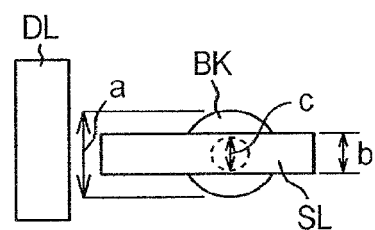
FIG. 5 is a plan view for showing a configuration of the thin film transistor shown in FIG. 3.

FIG. 5 is a diagram for illustrating, on a plane, a relation between the source/drain electrode and the projection BK of the configuration of the thin film transistor TFT explained using FIG. 4A to FIG. 4H. The width b of the source line SL on the projection BK is desirably larger than the maximum diameter c of a connection hole between the source line SL and the pixel electrode PX. This is because it can be expected that the metal source line SL serves as an etching stopper in an etching process to form the connection hole. Further, since the metal source line SL does not allow light to penetrate, the line width b is desirably narrower than the maximum width a of the projection BK from the viewpoint of securing the aperture ratio.

With the above-described configuration, the width of the source line SL can be made narrower, thus contributing to the improvement of the aperture ratio. Further, the inorganic passivation film PAS and the upper insulation film UPS can be patterned on the projection, and thus the processing likelihood is improved. Further, the common electrode CT and the upper insulation film UPS are laminated on a plane. Thus, even if thermal stress is applied, it is advantageously difficult for the common electrode CT and the upper insulation film UPS to be separated from each other at the interface. In addition, since the projection is formed in advance, processing of the organic passivation film IN is advantageously easy.

In the embodiment, the projection BK is formed by patterning the photosensitive material. However, it is obvious that the projection BK may be formed by another printing technique such as an ink-jet method. The patterning of the photosensitive material has advantages in excellent positional accuracy. On the other hand, if a printing technique is used, only one process is advantageously required to arrange the projection BK at a desired position. Further, the electrodes of the TFT are formed by photolithography and wet etching in the embodiment. Instead, the electrodes may be formed by a printing method known by those skilled in the art.

Comparative Example

Hereinafter, a display device to be compared with the configuration of that of the present invention will be described as a comparative example. An equivalent circuit of the display device is the same as that of the present invention.

Figure 6:
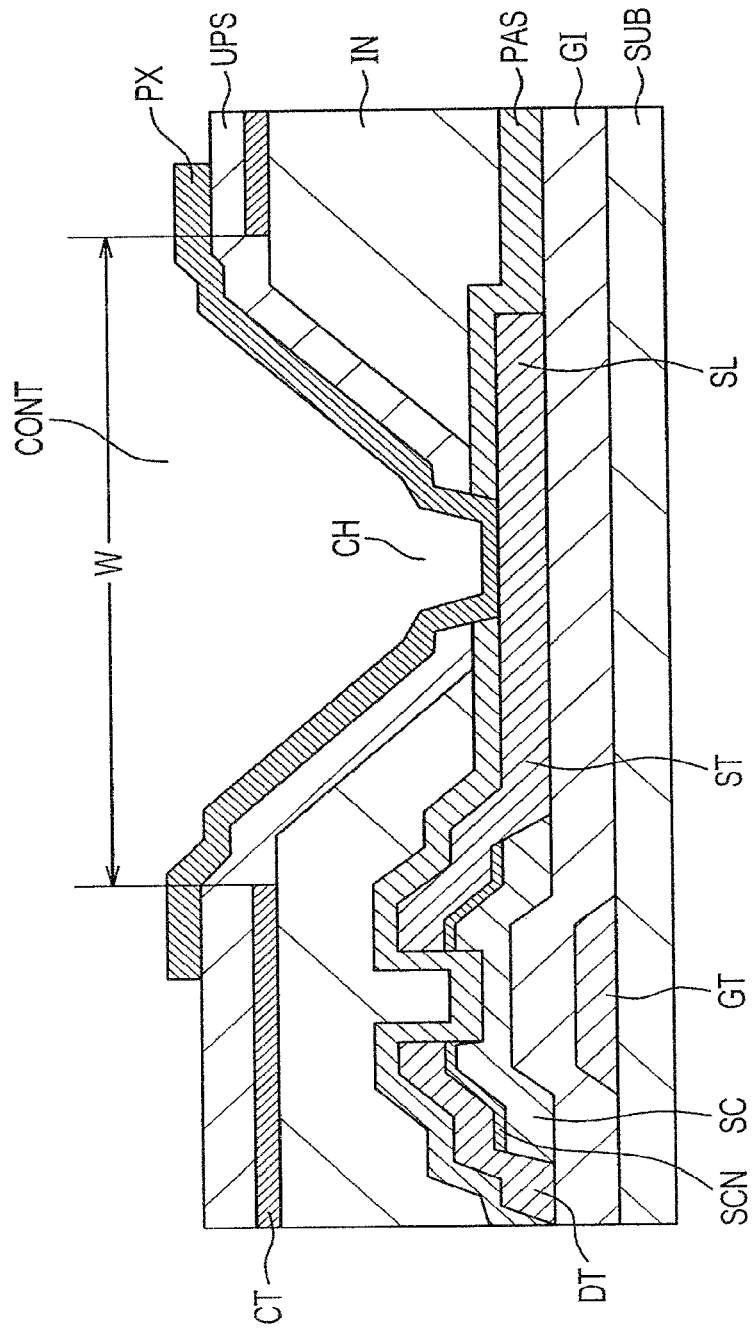
FIG. 6 is a cross-sectional view for showing a comparative example of a thin film transistor.

FIG. 6 is a cross-sectional view of a thin film transistor TFT included in a pixel circuit of a comparative example. On a glass substrate SUB, provided is a conductive layer including a gate electrode GT in contact with the glass substrate SUB. On the conductive layer, provided is a gate insulation layer GI. A semiconductor film SC is in contact with the upper face of the gate insulation layer GI, and is provided above the gate electrode GT. On the upper face of the semiconductor film SC, disposed are a source electrode ST and a drain electrode DT that are apart from each other. A source line SL extends from the source electrode ST, and is connected to a pixel electrode PX at a base portion of a contact hole CONT.

An inorganic passivation film PAS and an organic passivation film IN are formed so as to cover the thin film transistor TFT. The contact hole CONT is formed in the organic passivation film IN. On the organic passivation film IN, formed is a common electrode CT. The common electrode CT is opened at the contact hole CONT. Further, an upper insulation film UPS is formed so as to cover the common electrode CT and the contact hole CONT, and the pixel electrode PX is formed on the upper insulation film UPS. The source line SL is connected to the pixel electrode PX at a connection hole CH formed in the inorganic passivation film PAS and the upper insulation film UPS at a base portion of the contact hole CONT.

Figure 8:
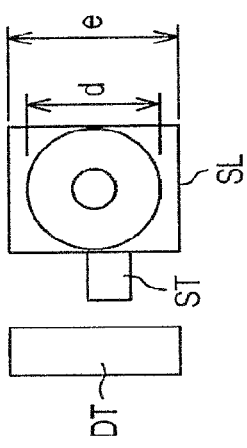
FIG. 8 is a plan view for showing a configuration of the thin film transistor shown in FIG. 6.

It should be noted that the orientation of liquid crystal is disturbed at inclined portions of the inner walls of the contact hole CONT in the configuration, and light leakages occur. As a countermeasure against this, the source line SL is provided at an area covering the opening portion on the upper face of the contact hole CONT when viewed on a plane (FIG. 8).

Hereinafter, processes of manufacturing the thin film transistor TFT will be described. FIG. 7A to FIG. 7F are cross-sectional views for showing manufacturing processes of the thin film transistor TFT shown in FIG. 6. The process of forming the gate electrode GT to the process of forming the semiconductor film SC are the same as those in the first embodiment (see FIG. 7A).

Figure 7A:
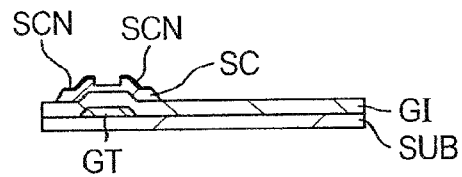
FIG. 7A is a cross-sectional view for showing a manufacturing process of the thin film transistor shown in FIG. 6.
Figure 7B:
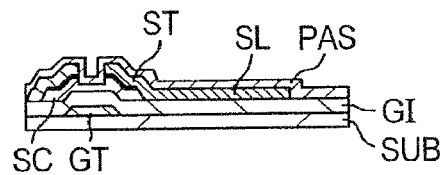
FIG. 7B is a cross-sectional view for showing a manufacturing process of the thin film transistor shown in FIG. 6.

In the next process, a Ti layer with a thickness of 100 nm, an AlSi layer with a thickness of 450 nm, and a Ti layer with a thickness of 100 nm are sequentially deposited, and photolithography and dry etching are performed for these films to form the source electrode ST and the drain electrode DT. Further, a silicon nitride film configuring the inorganic passivation film PAS is deposited using a CVD method (FIG. 7B).

Figure 7C:
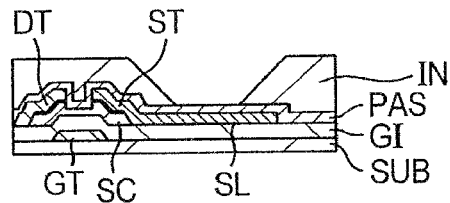
FIG. 7C is a cross-sectional view for showing a manufacturing process of the thin film transistor shown in FIG. 6.

In the next process, the organic passivation film IN with a thickness of 2 μm is applied and formed. Further, the organic passivation film IN is processed by photolithography to form a hole in a mortar shape, and then is heated to burn (FIG. 7C). In this process, the thickness of the organic passivation film IN to be processed is large, and thus the exposure time becomes longer as compared to the first embodiment.

Figure 7D:
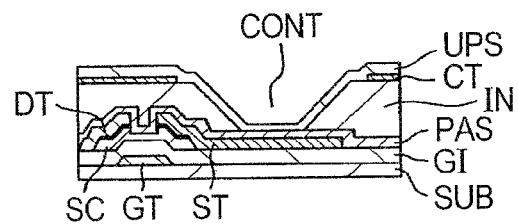
FIG. 7D is a cross-sectional view for showing a manufacturing process of the thin film transistor shown in FIG. 6.

In the next process, for example, a transparent conductive film such as ITO is further deposited and patterned to form the common electrode CT, and then the upper insulation film UPS is formed (FIG. 7D). The common electrode CT is patterned, so that a window W is opened near the contact hole CONT when viewed on a plane.

Figure 7E:
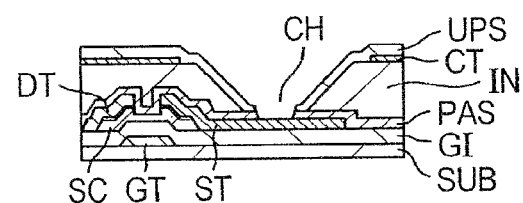
FIG. 7E is a cross-sectional view for showing a manufacturing process of the thin film transistor shown in FIG. 6.

In the next process, the common electrode CT and the upper insulation film UPS are collectively processed and opened at a base portion of the contact hole CONT by photolithography and dry etching, and the source line SL is exposed (FIG. 7E). In the process, photoresist is accumulated in the bottom of the contact hole CONT at the time of photolithography. Thus, a large amount of exposure is required, and the resolution is decreased. The alignment control in the bottom of the hole is difficult as compared to the first embodiment.

Figure 7F:
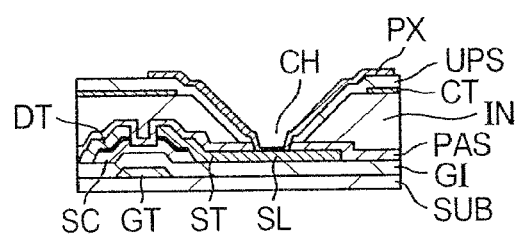
FIG. 7F is a cross-sectional view for showing a manufacturing process of the thin film transistor shown in FIG. 6.

In the next process, for example, a transparent conductive film such as ITO is deposited and patterned to form the pixel electrode PX so as to be connected to the source line SL at the connection hole CH. Accordingly, the display device including the thin film transistor TFT shown in FIG. 6 can be completed (FIG. 7F). If a heating process is performed thereafter, the directions of thermal stress applied to the upper insulation film UPS located at the inclined portion of the contact hole CONT and the common electrode CT located at a flat portion are different from each other because an end of the common electrode CT is located at an end of the opening of the contact hole CONT, and thus they are likely to be separated from each other.

FIG. 8 is a diagram for illustrating, on a plane, a relation between the source/drain electrode and the contact hole CONT of the configuration of the thin film transistor TFT explained using FIG. 6. The width e of the source line SL is desirably larger than the opening diameter d of the contact hole CONT at the contact hole CONT. This is because the orientation of liquid crystal molecules is disturbed at the inclined portions of the contact hole CONT to cause light leakages, and thus it can be expected that the light leakages can be prevented by providing the source line SL made of metal that does not allow light to penetrate. However, the aperture ratio is decreased.

Second Embodiment

Figure 9:
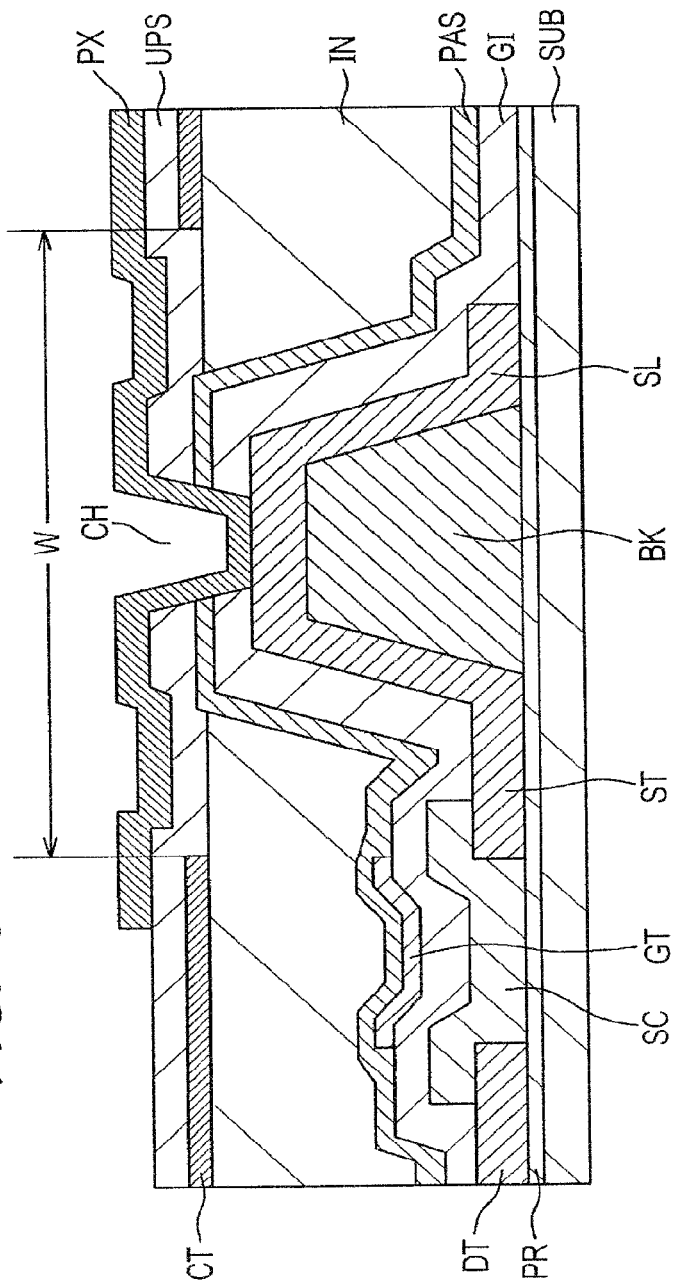
FIG. 9 is a cross-sectional view of a thin film transistor included in a pixel circuit according to a second embodiment.

Hereinafter, a display device having a different configuration of the present invention will be described. An equivalent circuit of the display device is the same as that of the first embodiment. FIG. 9 is a cross-sectional view of a thin film transistor TFT included in a pixel circuit. On a glass substrate SUB, provided are a projection BK, a semiconductor layer, a source line, and a drain line. A gate insulation layer GI is provided on the semiconductor layer, the source line, and the drain line. A semiconductor film SC is in contact with the upper face of a barrier layer PR, and ends thereof are overlapped with a source electrode and a drain electrode. A gate electrode GT is provided on the gate insulation layer GI so as to be overlapped with the semiconductor layer on a plane. An inorganic passivation film PAS is located on the gate electrode GT to cover the thin film transistor TFT and the projection BK.

A source line SL extends over the projection BK from a source electrode ST, and is connected to a pixel electrode PX on the projection BK. An organic passivation film IN covers the thin film transistor TFT, and embeds the projection BK therein. A common electrode CT, and then an upper insulation film UPS are formed on the organic passivation film IN. The source line SL is connected to the pixel electrode PX at a connection hole CH formed in the gate insulation layer GI, the inorganic passivation film PAS, and the upper insulation film UPS on the projection BK. In this case, on the projection BK, the source line SL extends from the source electrode along the top of the projection BK from a base portion thereof. In FIG. 9, in order to prevent impurities from the glass substrate SUB from contaminating the semiconductor layer SC, or to improve adhesion of the semiconductor layer, the barrier layer PR is formed on the glass substrate SUB.

Figure 10A:
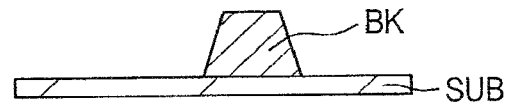
FIG. 10A is a cross-sectional view for showing a manufacturing process of the thin film transistor shown in FIG. 9.

Hereinafter, processes of manufacturing the thin film transistor TFT will be described. FIG. 10A to FIG. 10H are cross-sectional views for showing manufacturing processes of the thin film transistor TFT shown in FIG. 9. In FIG. 10A to FIG. 10H, the barrier layer PR formed on the glass substrate SUB is not illustrated. In the first process, the projection BK is formed on the glass substrate SUB by an ink-jet method (FIG. 10A). Ink landed on the glass substrate SUB by the ink-jet method forms the projection BK through a curing process such as light irradiation or heating. For the projection BK after the curing process, a material with a high transmissivity is desirable from the to viewpoint of securing the aperture ratio as long as an insulating material is used.

Figure 10B:
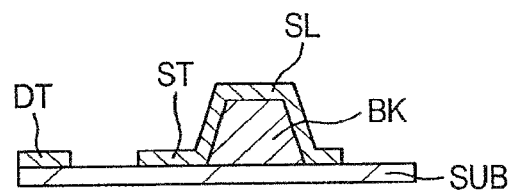
FIG. 10B is a cross-sectional view for showing a manufacturing process of the thin film transistor shown in FIG. 9.

In the next process, an ITO film is deposited, and photolithography and etching are performed for the film to form the source electrode ST and the drain electrode DT (FIG. 10B). Instead of depositing the layer, a single layer of low-resistance metal such as Al, Mo, W, Cu, Cu—Al alloy, Al—Si alloy, or Mo—W alloy, or a laminated structure thereof may be deposited. In this case, the source line SL is also formed at the same time by extending from the source electrode ST over the projection BK.

Figure 10C:
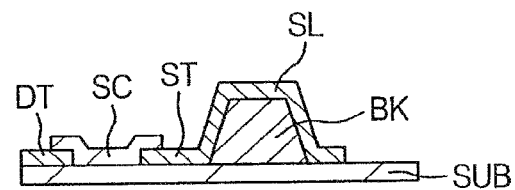
FIG. 10C is a cross-sectional view for showing a manufacturing process of the thin film transistor shown in FIG. 9.

In the next process, the semiconductor layer SC is formed by sputtering oxide semiconductor. A DC sputter is used as a sputtering method of the oxide semiconductor, and a target material with a ratio of In:Ga:Zn:O=1:1:1:4 is used. The semiconductor layer SC is etched by photolithography to form the semiconductor film SC in a desired shape (FIG. 10C).

Figure 10D:
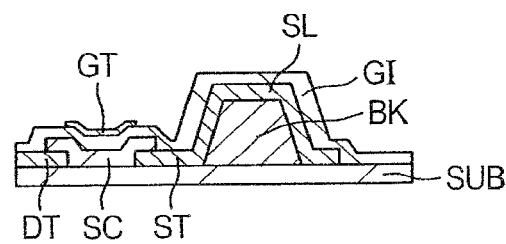
FIG. 10D is a cross-sectional view for showing a manufacturing process of the thin film transistor shown in FIG. 9.

In the next process, a silicon oxide film configuring the gate insulation layer GI is deposited on the glass substrate SUB on which the semiconductor film SC is formed. The silicon oxide film is deposited using a plasma CVD apparatus. Thereafter, an Al layer and an Mo layer are sequentially sputtered, and the gate electrode GT is formed by photolithography and etching (FIG. 10D). A single layer of low-resistance metal such as Al, Mo, W, Cu, Cu—Al alloy, Al—Si alloy, or Mo—W alloy, or a laminated structure thereof may be used for the gate electrode GT.

Figure 10E:
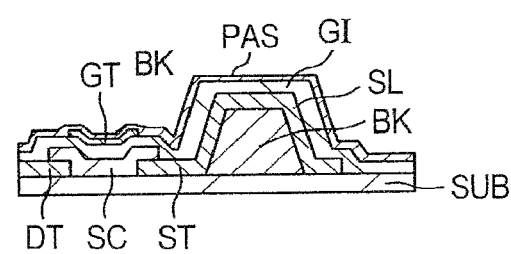
FIG. 10E is a cross-sectional view for showing a manufacturing process of the thin film transistor shown in FIG. 9.
Figure 10F:
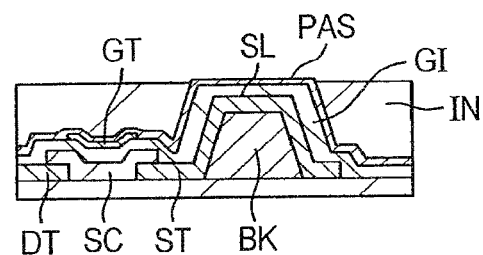
FIG. 10F is a cross-sectional view for showing a manufacturing process of the thin film transistor shown in FIG. 9.

In the next process, a silicon oxide film configuring the inorganic passivation film PAS to prevent moisture and impurities from entering from outside is deposited using a CVD method (FIG. 10E). Thereafter, the organic passivation film IN is applied and formed. Further, the organic passivation film IN is processed by photolithography, so that an upper portion of the projection BK is exposed. Thereafter, the resultant structure is burned while reflow and flattening are performed by heating (FIG. 10F). This process is the same as the first embodiment.

Figure 10G:
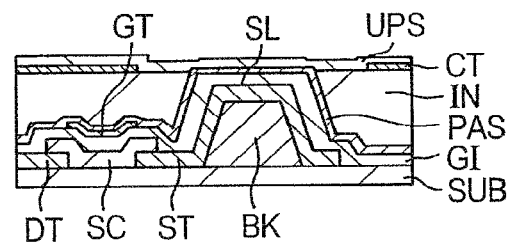
FIG. 10G is a cross-sectional view for showing a manufacturing process of the thin film transistor shown in FIG. 9.
Figure 10H:
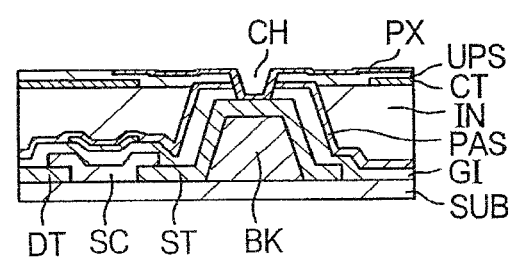
FIG. 10H is a cross-sectional view for showing a manufacturing process of the thin film transistor shown in FIG. 9.

In the next process, for example, a transparent conductive film such as ITO is further deposited and patterned to form the common electrode CT, and then the upper insulation film UPS is formed (FIG. 10G). The common electrode CT is patterned, so that a window W is opened near the projection BK when viewed on a plane. In the next process, the gate insulation layer GI, the inorganic passivation film PAS, and the upper insulation film UPS are collectively processed and opened at the top of the projection BK by photolithography and dry etching, and the source line SL is exposed. In the next process, for example, a transparent conductive film such as ITO is deposited and patterned to form the pixel electrode PX so as to be connected to the source line SL at the opening portion. Accordingly, the display device including the thin film transistor TFT shown in FIG. 9 can be completed (FIG. 10H).

With the above-described configuration, the width of the source line SL can be made narrower as similar to the first embodiment, and thus the aperture ratio can be improved. Further, the gate insulation layer GI, the inorganic passivation film PAS, and the upper insulation film UPS can be patterned on the projection, and thus the processing likelihood is improved. Further, the common electrode CT and the upper insulation film UPS are laminated on a plane. Thus, even if thermal stress is applied, it is advantageously difficult for the common electrode CT and the upper insulation film UPS to be separated from each other at the interface. In addition, since the projection is formed in advance, processing of the organic passivation film IN is advantageously easy.

Further, after the source line and the drain line are formed, the semiconductor layer is formed in the configuration of the embodiment. Thereafter, the semiconductor layer is covered with the gate insulation film. According to the configuration, physical and chemical affects by a plasma process or an etching process can be reduced in the following processes.

In the embodiment, the projection BK is formed by the ink-jet method. However, it is obvious that the projection BK may be formed by patterning, for example, a photosensitive material. If a printing technique such as the ink-jet method is used, only one process is advantageously required to arrange the projection BK at a desired position. On the other hand, the patterning of the photosensitive material has advantages in excellent positional accuracy. Further, the electrodes of the TFT are formed by photolithography and wet etching in the embodiment. Instead, the electrodes may be formed by a printing method known by those skilled in the art.

Third Embodiment

Hereinafter, a display device having a different configuration of the present invention will be described. An equivalent circuit of the display device is the same as that of the first embodiment. FIG. 11 is a cross-sectional view of a thin film transistor TFT included in a pixel circuit. On a glass substrate SUB, formed is a barrier layer PR on which a projection BK, a semiconductor film SC, a source line, and a drain line are provided. A gate insulation layer GI is provided on the semiconductor layer, the source line, and the drain line. A semiconductor film SC is in contact with the upper face of the barrier layer PR, and ends thereof are overlapped with a source electrode and a drain electrode.

A gate electrode GT is provided on the gate insulation layer GI so as to be overlapped with the semiconductor layer on a plane. An inorganic passivation film PAS is located on the gate electrode GT to cover the thin film transistor TFT and the projection BK. A source line SL extends over the projection BK from a source electrode ST, and is connected to a pixel electrode PX on the projection BK. An organic passivation film IN covers the thin film transistor TFT, and embeds the projection BK therein. A common electrode CT, and then an upper insulation film UPS are formed on the organic passivation film IN. The source line SL is connected to the pixel electrode PX at a connection hole CH formed in the gate insulation layer GI, the inorganic passivation film PAS, and the upper insulation film UPS on the projection BK.

In FIG. 11, on the projection BK, the source line SL extends from the source electrode along the top of the projection BK from a base portion thereof. In the embodiment, the source line SL terminates at the top of the projection BK. However, the source line SL may further extend as in the first embodiment. In FIG. 11, in order to prevent impurities from the glass substrate SUB from contaminating the semiconductor layer SC, or to improve adhesion of the semiconductor layer, the barrier layer PR is formed on the glass substrate SUB.

Figure 12A:
FIG. 12A is a cross-sectional view for showing a manufacturing process of the thin film transistor shown in FIG. 11.

Hereinafter, processes of manufacturing the thin film transistor TFT will be described. FIG. 12A to FIG. 12G are cross-sectional views for showing manufacturing processes of the thin film transistor TFT shown in FIG. 11. In FIG. 12A to FIG. 12G, the barrier layer PR formed on the glass substrate SUB is not illustrated. In the first process, amorphous silicon is sputtered on the glass substrate SUB to form an amorphous silicon layer by photolithography and wet etching. Thereafter, a laser beam is irradiated onto the amorphous silicon layer for crystallization to form the polycrystalline semiconductor film SC (FIG. 12A). It should be noted that a barrier film can be provided on the glass substrate SUB to improve adhesion or prevent impurities from diffusing.

Figure 12B:
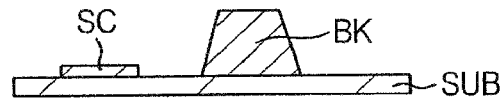
FIG. 12B is a cross-sectional view for showing a manufacturing process of the thin film transistor shown in FIG. 11.

In the next process, the projection BK is formed on the glass substrate SUB by an ink-jet method (FIG. 12B). Ink landed on the glass substrate SUB by the ink-jet method forms the projection BK through a curing process such as light irradiation or heating. For the projection BK after the curing process, a material with a high transmissivity is desirable from the viewpoint of securing the aperture ratio as long as an insulating material is used.

Figure 12C:
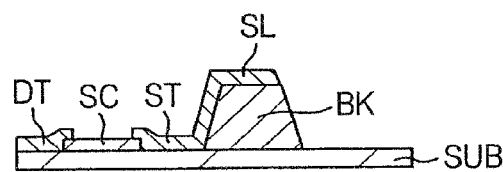
FIG. 12C is a cross-sectional view for showing a manufacturing process of the thin film transistor shown in FIG. 11.

In the next process, an Mo—Zr alloy film is deposited, and photolithography and etching are performed for the film to form the source electrode ST and the drain electrode DT (FIG. 12C). Instead of depositing the layer, a single layer of low-resistance metal such as Al, Mo, W, Cu, Cu—Al alloy, Al—Si alloy, or Mo—W alloy, or a laminated structure thereof may be deposited.

In this case, the source line SL is also formed at the same time by extending from the source electrode ST over the projection BK. Since the source line SL does not allow light to penetrate, the line width is desirably narrowed from the viewpoint of the aperture ratio. In the next process, a silicon oxide film configuring the gate insulation layer GI is deposited on the glass substrate SUB on which the semiconductor film SC, the source electrode, and the drain electrode are formed. The silicon oxide film is deposited using a plasma CVD apparatus.

Figure 12D:
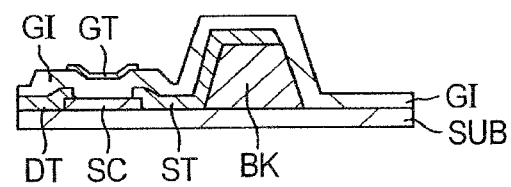
FIG. 12D is a cross-sectional view for showing a manufacturing process of the thin film transistor shown in FIG. 11.

Thereafter, a W layer is sputtered, and the gate electrode GT is formed by photolithography and etching (FIG. 12D). A single layer of low-resistance metal such as Al, Mo, W, Cu, Cu—Al alloy, Al—Si alloy, or Mo—W alloy, or a laminated structure thereof may be used for the gate electrode GT.

Figure 12E:
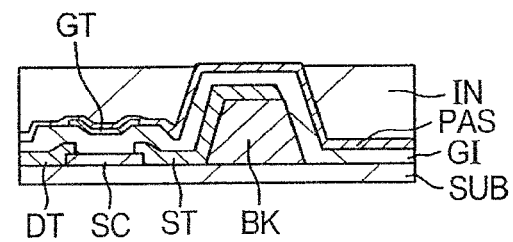
FIG. 12E is a cross-sectional view for showing a manufacturing process of the thin film transistor shown in FIG. 11.

In the next process, a silicon oxide film configuring the inorganic passivation film PAS to prevent moisture and impurities from entering from outside is deposited using a CVD method. Thereafter, the organic passivation film IN is applied and formed. Further, the organic passivation film IN is processed by photolithography, so that an upper portion of the projection BK is exposed. Thereafter, the resultant structure is burned while reflow and flattening are performed by heating (FIG. 12E). This process is the same as the first embodiment.

Figure 12F:
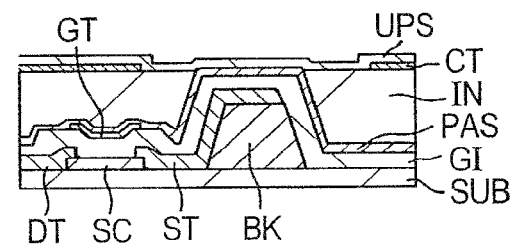
FIG. 12F is a cross-sectional view for showing a manufacturing process of the thin film transistor shown in FIG. 11.
Figure 12G:
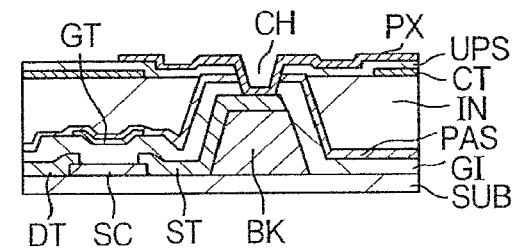
FIG. 12G is a cross-sectional view for showing a manufacturing process of the thin film transistor shown in FIG. 11.

In the next process, for example, a transparent conductive film such as ITO is further deposited and patterned to form the common electrode CT, and then the upper insulation film UPS is formed (FIG. 12F). The common electrode CT is patterned, so that a window W is opened near the projection BK when viewed on a plane. In the next process, the gate insulation layer GI, the inorganic passivation film PAS, and the upper insulation film UPS are collectively processed and opened at the top of the projection BK by photolithography and dry etching, and the source line SL is exposed. In the next process, for example, a transparent conductive film such as ITO is deposited and patterned to form the pixel electrode PX so as to be connected to the source line SL at the opening portion. Accordingly, the display device including the thin film transistor TFT shown in FIG. 11 can be completed (FIG. 12G).

With the above-described configuration, the width of the source line SL can be made narrower as similar to the first embodiment, and thus the aperture ratio can be improved. Further, the gate insulation layer GI, the inorganic passivation film PAS, and the upper insulation film UPS can be patterned on the projection, and thus the processing likelihood is improved. Further, the common electrode CT and the upper insulation film UPS are laminated on a plane. Thus, even if thermal stress is applied, it is advantageously difficult for the common electrode CT and the upper insulation film UPS to be separated from each other at the interface. In addition, since the projection is formed in advance, processing of the organic passivation film IN is advantageously easy. Further, due to the configuration in which the semiconductor film is first formed on the substrate, in the case where, for example, polycrystalline silicon is used as a semiconductor layer, the degree of freedom of processes such as conditions of laser irradiation and processing temperatures is advantageously increased.

In the embodiment, the projection BK is formed by the ink-jet method. However, it is obvious that the projection BK may be formed by patterning, for example, a photosensitive material. If a printing technique such as the ink-jet method is used, only one process is advantageously required to arrange the projection BK at a desired position. On the other hand, the patterning of the photosensitive material has advantages in excellent positional accuracy. Further, the electrodes of the TFT are formed by photolithography and wet etching in the embodiment. Instead, the electrodes may be formed by a printing method known by those skilled in the art.

Fourth Embodiment

Hereinafter, a display device having a different configuration of the present invention will be described. An equivalent circuit of the display device is the same as that of the first embodiment. The equivalent circuit shown in FIG. 1 shows pixel portions. However, the gate signal lines GL and the video signal lines DL are connected to respective driving circuits. In the embodiment, the pixel circuits and the driving circuits are formed on the same substrate.

Figure 13:
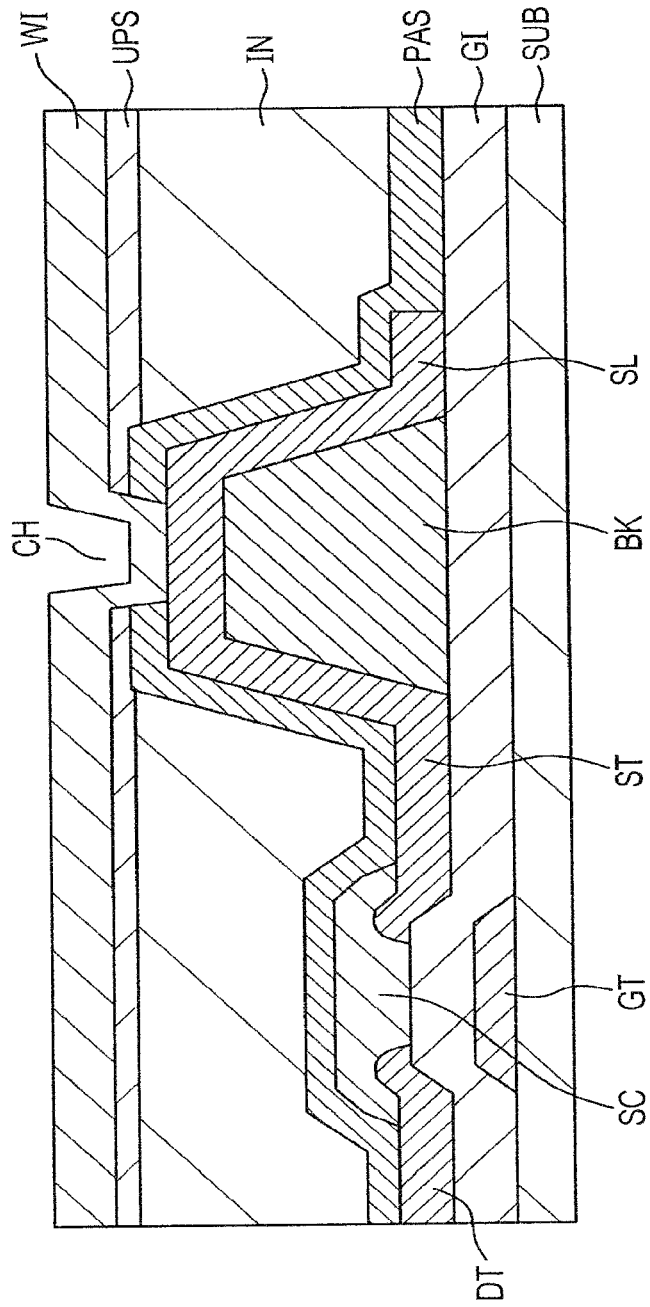
FIG. 13 is a cross-sectional view of a thin film transistor included in a driving circuit according to a fourth embodiment.

FIG. 13 is a cross-sectional view of a thin film transistor TFT included in the driving circuit. On a glass substrate SUB, provided is a conductive layer including a gate electrode GT in contact with the glass substrate SUB. On the conductive layer, provided is a gate insulation layer GI. Further, on the gate insulation layer GI, provided is a projection BK. On the upper face of the gate insulation layer GI, disposed are a source electrode ST and a drain electrode DT that are apart from each other. A source line SL extends over the projection BK from the source electrode ST, and is connected to an upper line WI on the projection BK.

A semiconductor film SC is in contact with the upper face of the gate insulation layer GI, and is provided above the gate electrode GT. Further, the semiconductor film SC is disposed so as to be overlapped with ends of the source electrode ST and the drain electrode DT that are apart from each other. Further, an inorganic passivation film PAS is formed to cover the thin film transistor TFT and the projection BK. In addition, an organic passivation film IN covers the thin film transistor TFT on the inorganic passivation film PAS, and embeds the projection BK therein. On the organic passivation film IN, formed is an upper insulation film UPS. The source line SL is connected to the upper line WI at a connection hole CH formed in the inorganic passivation film PAS and the upper insulation film UPS on the projection BK.

Figure 14A:
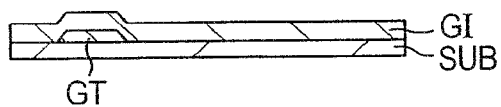
FIG. 14A is a cross-sectional view for showing a manufacturing process of the thin film transistor shown in FIG. 13.

Hereinafter, processes of manufacturing the thin film transistor TFT will be described. FIG. 14A to FIG. 14G are cross-sectional views for showing manufacturing processes of the thin film transistor TFT shown in FIG. 13. In the first process, an Al layer with a thickness of 350 nm and an Mo layer with a thickness of 100 nm are sequentially sputtered on the glass substrate SUB, and the gate electrode GT is formed by photolithography and wet etching. A single layer of low-resistance metal such as Al, Mo, W, Cu, Cu—Al alloy, Al—Si alloy, or Mo—W alloy, or a laminated structure thereof may be used for the gate electrode GT. In the next process, a silicon nitride film configuring the gate insulation film GI is deposited on the glass substrate SUB on which the gate electrode GT is formed (FIG. 14A). The silicon nitride film is deposited using a CVD apparatus.

Figure 14B:
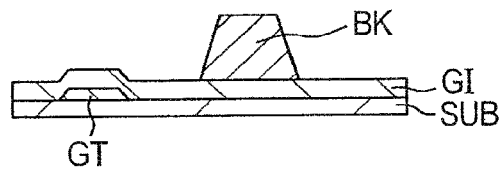
FIG. 14B is a cross-sectional view for showing a manufacturing process of the thin film transistor shown in FIG. 13.

In the next process, a photosensitive material is applied onto the gate insulation film GI, and then light is selectively irradiated to a desired area of the photosensitive material. Thereafter, the resultant structure is developed for patterning, so that the projection BK with a desired height is formed on the gate insulation film GI (FIG. 14B). The photosensitive material includes an organic insulation film material, a photospacer material, photoresist, and the like. In short, any material can be used as long as a convex portion can be formed at a desired area on a substrate by exposure and development.

Figure 14C:
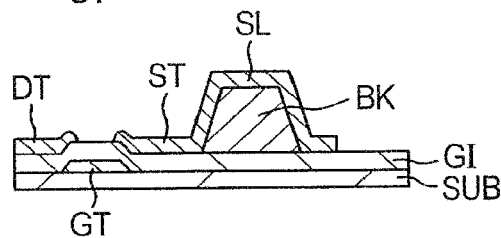
FIG. 14C is a cross-sectional view for showing a manufacturing process of the thin film transistor shown in FIG. 13.

In the next process, an AlSi layer with a thickness of 450 nm is deposited, and photolithography and dry etching are performed to form the source electrode ST and the drain electrode DT (FIG. 14C). Instead of depositing the layer, a material containing p-type impurities such as Al, Cu—Al alloy, and Al—Si alloy may be deposited.

Figure 14D:
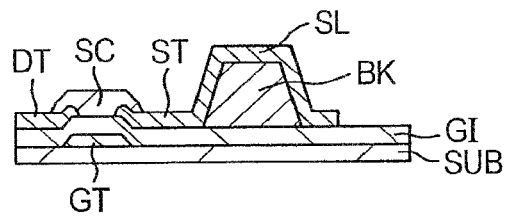
FIG. 14D is a cross-sectional view for showing a manufacturing process of the thin film transistor shown in FIG. 13.

In this case, the source line SL is also formed at the same time by extending from the source electrode ST over the projection BK. The source line SL does not allow light to penetrate. Thus, the line width is desirably narrowed from the viewpoint of the aperture ratio. Next, an amorphous silicon layer is formed using a CVD apparatus, and then is etched by photolithography to be in a desired shape, so that the semiconductor film SC of a semiconductor layer is formed (FIG. 14D). Thereafter, a heating process is added to diffuse Al from the AlSi layer to form a contact layer.

Figure 14E:
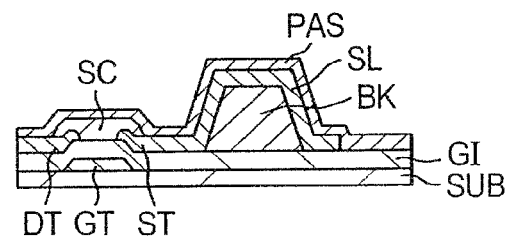
FIG. 14E is a cross-sectional view for showing a manufacturing process of the thin film transistor shown in FIG. 13.
Figure 14F:
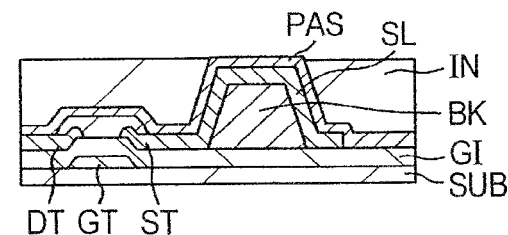
FIG. 14F is a cross-sectional view for showing a manufacturing process of the thin film transistor shown in FIG. 13.

In the next process, a silicon nitride film configuring the inorganic passivation film PAS to prevent moisture and impurities from entering from outside is deposited using a CVD method (FIG. 14E). Thereafter, the organic passivation film IN is applied and formed (FIG. 14F). This process is the same as the first embodiment.

Figure 14G:
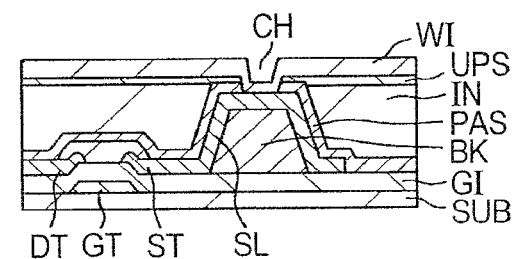
FIG. 14G is a cross-sectional view for showing a manufacturing process of the thin film transistor shown in FIG. 13.

In the next process, after the upper insulation film UPS is formed, the inorganic passivation film PAS and the upper insulation film UPS are collectively processed and opened at the top of the projection BK by photolithography and dry etching, and the source line SL is exposed. In the next process, for example, a transparent conductive film such as ITO is deposited and patterned to form the upper line WI so as to be connected to the source line SL at the opening portion. Accordingly, the display device including the thin film transistor TFT shown in FIG. 13 can be completed (FIG. 14G). The embodiment shows an example of a p-type transistor configuring a peripheral driving circuit of the display device.

With the above-described configuration, the inorganic passivation film PAS and the upper insulation film UPS can be patterned on the projection, and thus the processing likelihood is improved as similar to the first embodiment. In addition, since the projection is formed in advance, processing of the organic passivation film IN is advantageously easy. Further, the semiconductor layer can be formed after forming the lines, and thus it is advantageous in damage control for the semiconductor layer.

In the embodiment, the projection BK is formed by patterning the photosensitive material. However, it is obvious that the projection BK may be formed by another printing technique such as an ink-jet method. The patterning of the photosensitive material has advantages in excellent positional accuracy. On the other hand, if a printing technique is used, only one process is advantageously required to arrange the projection BK at a desired position. Further, the electrodes of the TFT are formed by photolithography and wet etching in the embodiment. Instead, the electrodes may be formed by a printing method known by those skilled in the art.

Fifth Embodiment

Figure 15:
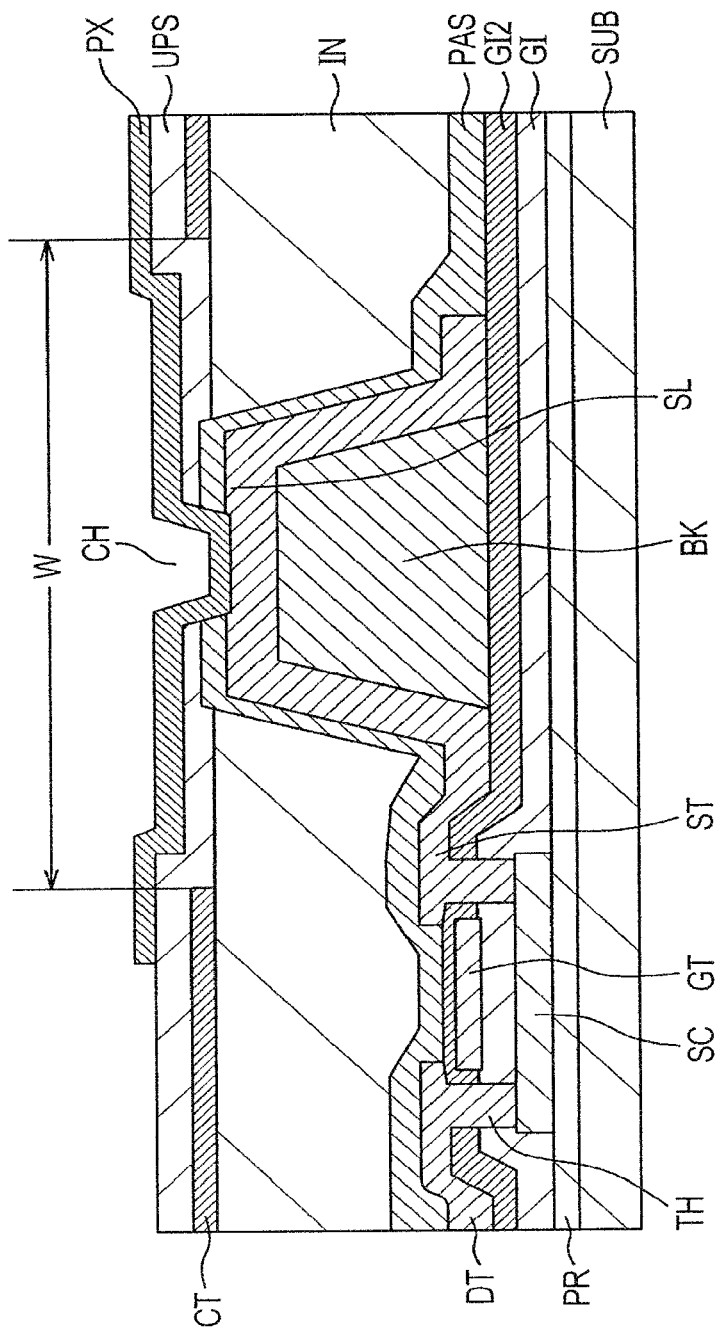
FIG. 15 is a cross-sectional view of a thin film transistor included in a pixel circuit according to a fifth embodiment.

Hereinafter, a display device having a different configuration of the present invention will be described. An equivalent circuit of the display device is the same as that of the first embodiment. FIG. 15 is a cross-sectional view of a thin film transistor TFT included in a pixel circuit. In order to prevent impurities from a glass substrate SUB from diffusing and to improve adhesion, a barrier film PR is provided on the glass substrate SUB. Further, a semiconductor film SC in contact with the barrier film PR is provided, and on the semiconductor film SC, provided is a gate insulation layer GI. A gate electrode GT is provided on the gate insulation layer GI so as to be overlapped with the semiconductor film SC on a plane, and an interlayer insulation film GI2 is provided so as to cover the gate electrode GT. Further, a projection BK is provided on the interlayer insulation film GI2.

On the upper face of the interlayer insulation film GI2, disposed are a source electrode ST and a drain electrode DT that are apart from each other. The source electrode ST and the drain electrode DT are connected to the semiconductor film SC through through-holes TH penetrating the gate insulation layer GI and the interlayer insulation film GI2. A source line SL extends over the projection BK from the source electrode ST, and is connected to a pixel electrode PX on the projection BK. Further, an inorganic passivation film PAS is formed to cover the thin film transistor TFT, the projection BK, the source electrode ST, the drain electrode DT, and the source line SL. In addition, an organic passivation film IN covers the thin film transistor TFT on the inorganic passivation film PAS, and embeds the projection BK therein. A common electrode CT, and then an upper insulation film UPS are formed on the organic passivation film IN. The source line SL is connected to the pixel electrode PX at a connection hole CH formed in the inorganic passivation film PAS and the upper insulation film UPS on the projection BK.

Figure 16A:
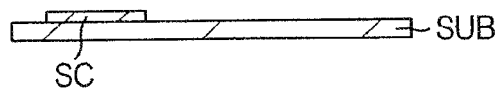
FIG. 16A is a cross-sectional view for showing a manufacturing process of the thin film transistor shown in FIG. 15.

Hereinafter, processes of manufacturing the thin film transistor TFT will be described. FIG. 16A to FIG. 16H are cross-sectional views for showing manufacturing processes of the thin film transistor TFT shown in FIG. 15. In the first process, the barrier film PR mainly made of silicon nitride is formed on the glass substrate SUB by CVD to improve adhesion and to prevent impurities from diffusing, and then amorphous silicon is sputtered to form an amorphous silicon layer by photolithography and wet etching. In FIG. 16A to FIG. 16H, the barrier film PR is not illustrated. Thereafter, a laser beam is irradiated onto the amorphous silicon layer for crystallization to form the polycrystalline semiconductor film SC (FIG. 16A).

Figure 16B:
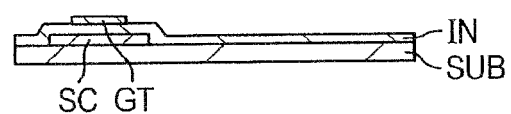
FIG. 16B is a cross-sectional view for showing a manufacturing process of the thin film transistor shown in FIG. 15.

In the next process, a silicon oxide film configuring the gate insulation layer GI is deposited on the glass substrate SUB on which the semiconductor film SC is formed. The silicon oxide film is deposited using a plasma CVD apparatus. Thereafter, a W layer is sputtered, and the gate electrode GT is formed by photolithography and etching (FIG. 16B). A single layer of low-resistance metal such as Al, Mo, W, Cu, Cu—Al alloy, Al—Si alloy, or Mo—W alloy, or a laminated structure thereof may be used for the gate electrode GT.

Figure 16C:
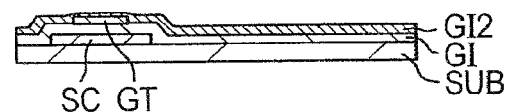
FIG. 16C is a cross-sectional view for showing a manufacturing process of the thin film transistor shown in FIG. 15.
Figure 16D:
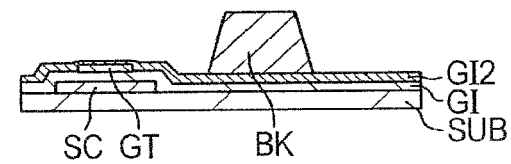
FIG. 16D is a cross-sectional view for showing a manufacturing process of the thin film transistor shown in FIG. 15.
Figure 16E:
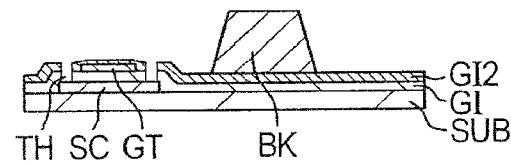
FIG. 16E is a cross-sectional view for showing a manufacturing process of the thin film transistor shown in FIG. 15.

In the next process, a silicon oxide film configuring the interlayer insulation film GI2 is deposited using a CVD method (FIG. 16C). Thereafter, the projection BK is formed on the interlayer insulation film GI2 by an ink-jet method (FIG. 16D). Ink landed on the glass substrate SUB by the ink-jet method forms the projection BK through a curing process such as light irradiation or heating. For the projection BK after the curing process, a material with a high transmissivity is desirable from the viewpoint of securing the aperture ratio as long as an insulating material is used. Further, the through-holes TH penetrating from the surface of the interlayer insulation film GI2 to the semiconductor film SC are formed in the gate insulation layer GI and the interlayer insulation film GI2 by photolithography and etching (FIG. 16E).

Figure 16F:
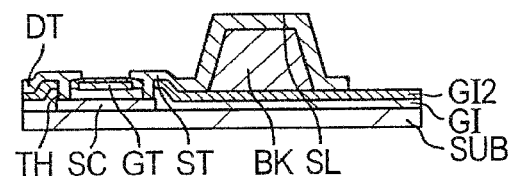
FIG. 16F is a cross-sectional view for showing a manufacturing process of the thin film transistor shown in FIG. 15.

In the next process, a W layer is deposited using a CVD method, and photolithography and dry etching are performed to form the source electrode ST and the drain electrode DT (FIG. 16F). In this case, the through-holes TH are filled at the same time, and the source electrode ST, the drain electrode DT, and the semiconductor film SC are connected to each other. Further, after the W layer is deposited, for example, materials such as Al, Cu—Al alloy, and Al—Si alloy may be deposited and laminated to suppress the resistance of the line portion.

Figure 16G:
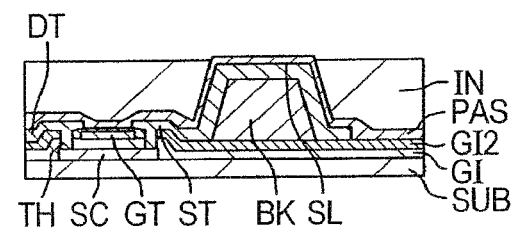
FIG. 16G is a cross-sectional view for showing a manufacturing process of the thin film transistor shown in FIG. 15.

In this case, the source line SL is also formed at the same time by extending from the source electrode ST over the projection BK. Since the source line SL does not allow light to penetrate, the line width is desirably narrowed from the viewpoint of the aperture ratio. In the next process, a silicon nitride film configuring the inorganic passivation film PAS to prevent moisture and impurities from entering from outside is deposited using a CVD method. Thereafter, the organic passivation film IN is applied and formed (FIG. 16G). This process is the same as the first embodiment.

Figure 16H:
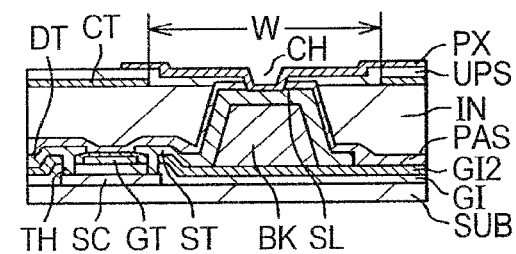
FIG. 16H is a cross-sectional view for showing a manufacturing process of the thin film transistor shown in FIG. 15.

In the next process, for example, a transparent conductive film such as ITO is further deposited and patterned to form the common electrode CT, and then the upper insulation film UPS is formed. The common electrode CT is patterned, so that a window W is opened near the projection BK when viewed on a plane. Further, the inorganic passivation film PAS and the upper insulation film UPS are collectively processed and opened at the top of the projection BK by photolithography and dry etching, and the source line SL is exposed. Next, for example, a transparent conductive film such as ITO is deposited and patterned so as to be connected to the source line SL at the connection hole CH, so that the pixel electrode PX is formed. Accordingly, the display device including the thin film transistor TFT shown in FIG. 11 can be completed (FIG. 16H).

With the above-described configuration, the width of the source line SL can be made narrower as similar to the first embodiment, thus contributing to the improvement of the aperture ratio. Further, the gate insulation layer GI, the inorganic passivation film PAS, and the upper insulation film UPS can be patterned on the projection, and thus the processing likelihood is improved. Further, the common electrode CT and the upper insulation film UPS are laminated on a plane. Thus, even if thermal stress is applied, it is advantageously difficult for the common electrode CT and the upper insulation film UPS to be separated from each other at the interface. In addition, since the projection is formed in advance, processing of the organic passivation film IN is advantageously easy.

Further, due to the configuration in which the semiconductor film is first formed on the substrate, in the case where, for example, polycrystalline silicon is used as a semiconductor layer, the degree of freedom of processes such as conditions of laser irradiation and processing temperatures is advantageously increased. Further, after the semiconductor layer is protected by the gate insulation film, the projection and lines are formed. Thus, it is advantageous in damage control for the semiconductor layer.

In the embodiment, the projection BK is formed by the ink-jet method. However, it is obvious that the projection BK may be formed by patterning, for example, a photosensitive material. If a printing technique such as the ink-jet method is used, only one process is advantageously required to arrange the projection BK at a desired position. On the other hand, the patterning of the photosensitive material has advantages in excellent positional accuracy. Further, the electrodes of the TFT are formed by photolithography and wet etching in the embodiment. Instead, the electrodes may be formed by a printing method known by those skilled in the art.

In the above description, the configuration of the present invention including the TFTs in the pixels has been described in each of the first to third embodiments and fifth embodiment. In addition, the configuration of the present invention including the TFTs in the driving circuits has been described in the fourth embodiment. However, the first to fifth embodiments may be used as configurations in the pixels or the peripheral driving circuits.

It should be noted that the liquid crystal display device has been described in each of the plural embodiments of the present invention. However, the present invention is not limited to those, but can be obviously applied to other display devices such as organic/inorganic EL (Electro Luminescence) elements, or semiconductor devices such as solar cells, memories, and power controlling semiconductors as long as the similar laminated structure of the insulation layer and the conductive layer is provided.

Further, the invention achieved by the inventors has been concretely described above on the basis of the embodiments. However, the present invention is not limited to the embodiments, but can be variously changed without departing from the gist of the present invention.

Further, the present invention is not limited to the above-described embodiments, but includes various modifications. For example, the embodiments have been described in detail to understandably explain the present invention, and are not necessarily limited to those having the all constitutional elements described above. Further, a part of the configuration in one embodiment can be replaced by a configuration of another embodiment, and the configuration in one embodiment can be added to another embodiment. In addition, a part of the configuration in the embodiments can be added to or replaced by another, or deleted.

Although the reference numerals have been described in the embodiments using the drawings, the main reference numerals will be described below again.

DESCRIPTION OF REFERENCE NUMERALS

CL common signal line
CT common electrode
CH connection hole
CONT contact hole
DL video signal line
GL gate signal line
PX pixel electrode
TFT thin film transistor
DT drain electrode
BK projection
GI gate insulation film
GI12 interlayer insulation film
GT gate electrode
PAS inorganic passivation film
IN organic passivation film
UPS upper insulation film
SC semiconductor film
SCN contact layer
ST source electrode
SL source line
SUB glass substrate
TH through-hole
PR barrier film
WI upper line layer

What is claimed is:

1. A semiconductor device which is configured to include a substrate,
wherein a transistor and a projection are disposed on the substrate;
a source electrode of the transistor extends so as to cover at least a part of the projection including at least part of an upper surface of the projection;
an inorganic passivation film is formed over the transistor and at least part of the upper surface of the projection;
an organic passivation film is formed on the inorganic passivation film over the transistor;
the projection is formed by an organic material and is formed separately from the organic passivation film;
an upper insulation film is formed over the organic passivation film and on the inorganic passivation film over the upper surface of the projection;
an upper line is formed on the upper insulation film: and
the upper line is electrically connected to the source electrode through a connection hole formed in the inorganic passivation film and the upper insulation film over the upper surface of the projection.

2. The semiconductor device according to claim 1,
wherein the transistor and the project ion are formed on a barrier film formed on the substrate;
the transistor is configured in such a manner that a semiconductor layer is formed on the barrier film, a gate insulation film is formed over the semiconductor layer, a gate electrode is formed on the gate insulation film at a portion corresponding to the semiconductor layer, an interlayer insulation film is formed over the gate electrode, a drain electrode and the source electrode that are apart from each other are formed on the interlayer insulation film at a portion corresponding to the semiconductor layer, and the drain electrode and the source electrode are electrically connected to the semiconductor layer through through-holes formed in the interlayer insulation film and the gate insulation film; and
the projection is formed on the interlayer insulation film extending from the transistor.

3. The semiconductor device according to claim 1,
wherein the transistor is configured in such a manner that a gate electrode is formed on the substrate, a gate insulation film is formed over the gate electrode, and a drain electrode and the source electrode are formed on the gate insulation film above the gate electrode;
the projection is formed on the gate insulation film extending from the transistor; and
the interconnection is electrically connected to the source electrode through the connection hole formed in the inorganic passivation film and the upper insulation film on the projection.

4. The semiconductor device according to claim 1,
wherein the transistor and the projection are formed on a barrier film formed on the substrate;
the transistor is configured in such a manner that a drain electrode and the source electrode are formed on the barrier film, a semiconductor layer is formed on the barrier film, the drain electrode, and the source electrode, a gate insulation film is formed over the semiconductor layer, and a gate electrode is formed on the gate insulation film at a portion corresponding to the semiconductor layer;
the interconnection is electrically connected to the source electrode through the connection hole formed in the gate insulation film, the inorganic passivation film, and the upper insulation film on the projection; and the projection is directly formed on the barrier film.

5. The semiconductor device according to claim 1, wherein the transistor and the projection are formed on a barrier film formed on the substrate;

the transistor is configured in such a manner that a semiconductor layer is formed on the barrier layer, a drain electrode and the source electrode are formed on the semiconductor layer at an interval, a gate insulation film is formed over the semiconductor layer, and a gate electrode is formed on the gate insulation film at a portion corresponding to the semiconductor layer; and the projection is directly formed on the barrier film.

6. The semiconductor device according to claim 1, wherein the transistor is configured in such a manner that a gate electrode is formed on the substrate, a gate insulation film is formed over the gate electrode, a drain electrode and the source electrode are formed on the gate insulation film above the gate electrode, and a semiconductor layer is formed above the gate electrode over the gate insulation film, a part of the drain electrode, and a part of the source electrode.

7. The semiconductor device according to claim 1, wherein the projection is a circular truncated cone or a truncated pyramid.

8. The semiconductor device according to claim 7, wherein no organic passivation film exists on an upper face of the projection.

* * * * *